(12) United States Patent
Ma et al.

(10) Patent No.: US 11,695,081 B2
(45) Date of Patent: Jul. 4, 2023

(54) CHANNEL LAYER FORMATION FOR III-V METAL-OXIDE-SEMICONDUCTOR FIELD EFFECT TRANSISTORS (MOSFETS)

(71) Applicant: Intel Corporation, Santa Clara, CA (US)

(72) Inventors: Sean Ma, Portland, OR (US); Nicholas Minutillo, Beaverton, OR (US); Cheng-Ying Huang, Hillsboro, OR (US); Tahir Ghani, Portland, OR (US); Jack Kavalieros, Portland, OR (US); Anand Murthy, Portland, OR (US); Harold Kennel, Portland, OR (US); Gilbert Dewey, Beaverton, OR (US); Matthew Metz, Portland, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1096 days.

(21) Appl. No.: 16/024,701

(22) Filed: Jun. 29, 2018

(65) Prior Publication Data
US 2020/0006576 A1    Jan. 2, 2020

(51) Int. Cl.
*H01L 29/786* (2006.01)
*H01L 29/205* (2006.01)
*H01L 29/66* (2006.01)
*H01L 29/04* (2006.01)
*H01L 29/423* (2006.01)

(52) U.S. Cl.
CPC ...... *H01L 29/78696* (2013.01); *H01L 29/045* (2013.01); *H01L 29/205* (2013.01); *H01L 29/42392* (2013.01); *H01L 29/66462* (2013.01)

(58) Field of Classification Search
CPC . H01L 29/16; H01L 29/775; H01L 29/42392; H01L 29/785; H01L 29/1083
See application file for complete search history.

(56) References Cited

U.S. PATENT DOCUMENTS

| | | | |
|---|---|---|---|
| 2014/0084246 A1* | 3/2014 | Pillarisetty | .............. H01L 29/16 |
| | | | 257/E29.245 |
| 2014/0225065 A1* | 8/2014 | Rachmady | ........ H01L 29/78696 |
| | | | 438/283 |

(Continued)

FOREIGN PATENT DOCUMENTS

| | | | | |
|---|---|---|---|---|
| WO | WO-2016105426 A1 * | 6/2016 | ....... | H01L 21/76224 |
| WO | WO-2016105437 A1 * | 6/2016 | ....... | H01L 21/02381 |

*Primary Examiner* — Brian Turner
(74) *Attorney, Agent, or Firm* — Schwabe, Williamson & Wyatt P.C.

(57) ABSTRACT

Embodiments herein describe techniques, systems, and method for a semiconductor device. A semiconductor device may include isolation areas above a substrate to form a trench between the isolation areas. A first buffer layer is over the substrate, in contact with the substrate, and within the trench. A second buffer layer is within the trench over the first buffer layer, and in contact with the first buffer layer. A channel area is above the first buffer layer, above a portion of the second buffer layer that are below a source area or a drain area, and without being vertically above a portion of the second buffer layer. In addition, the source area or the drain area is above the second buffer layer, in contact with the second buffer layer, and adjacent to the channel area. Other embodiments may be described and/or claimed.

22 Claims, 7 Drawing Sheets

(56) References Cited

U.S. PATENT DOCUMENTS

| | | | |
|---|---|---|---|
| 2015/0090958 A1* | 4/2015 | Yang | H01L 29/785 |
| | | | 257/27 |
| 2015/0162436 A1* | 6/2015 | Toh | H01L 29/7851 |
| | | | 438/283 |
| 2017/0069763 A1* | 3/2017 | Doris | H01L 29/775 |
| 2017/0110374 A1* | 4/2017 | Xu | H01L 29/0673 |
| 2017/0213913 A1* | 7/2017 | Lee | H01L 29/155 |
| 2019/0157386 A1* | 5/2019 | Ando | H01L 29/775 |

\* cited by examiner

CHANNEL LAYER FORMATION FOR III-V METAL-OXIDE-SEMICONDUCTOR FIELD EFFECT TRANSISTORS (MOSFETS)

FIELD

Embodiments of the present disclosure generally relate to the field of integrated circuits, and more particularly, to III-V metal-oxide-semiconductor field effect transistors (MOSFETs).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Traditional integrated circuits, e.g., metal-oxide-semiconductor field effect transistors (MOSFETs), may be based on silicon. On the other hand, compounds of group III-V elements may have superior semiconductor properties than silicon, including higher electron mobility and saturation velocity, leading to better performance for III-V MOSFETs, or simply III-V transistors. However, the fabrication process for III-V MOSFETs may be complicated with high defect product rates.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Compounds of group III-V elements such as gallium arsenide (GaAs), indium antimonide (InSb), indium phosphide (InP), and indium gallium arsenide (InGaAs) have superior semiconductor properties than silicon, including higher electron mobility and saturation velocity. As a result, III-V metal-oxide-semiconductor field effect transistors (MOSFETs) may have better performance than silicon transistors as well. An III-V MOSFET, or simply referred to as an III-V transistor, may include a source area and a drain area adjacent to a channel area. For the description below, a source area and a drain area may be used interchangeably.

Sometimes, III-V transistors may be made using aspect ratio trapping (ART) trenches. However, III-V transistors made using ART trenches may have low density of states and high defect rates, such as stacking faults formed during material growth in confined channels in the ART trenches. In addition, there may be a large lattice mismatch between an III-V material in a channel area with a material in an ART trench, which may lead to a large number of misfit dislocations and stacking faults in the channel area. Some approaches may use a lattice-matched sub-fin epitaxial layer such as InAlAs to reduce the number of misfit dislocations in the channel area. However, such a lattice-matched sub-fin epitaxial layer may be difficult to fabricate in a confined geometry such as an ART trench. As a result, more defects may be generated by the lattice-matched sub-fin epitaxial layer that propagate into the channel area.

Embodiments herein may form a first buffer layer over a substrate within an ART trench, and form a second buffer layer over the first buffer layer, in contact with the first buffer layer, and within the trench. A channel area may be formed above a portion of the second buffer layer. For example, a first buffer layer may include GaAs, the channel area may include InP, which may have a large lattice mismatch with GaAs in the first buffer layer. A second layer of InGaAs may be formed above the first buffer layer of GaAs. A channel area including InP may be formed by lattice matched over the second buffer layer of InGaAs. Hence, the channel area including InP may be virtually free of any misfit dislocation. Afterwards, the second buffer layer of InGaAs may be removed under the channel area, a gate dielectric layer and a gate electrode may be formed between the channel area and the first buffer layer, occupying the space where the second buffer layer has occupied before the second buffer layer is removed. Embodiments so formed using two buffer layers may reduce defects, namely, misfit dislocations in the channel area including InP, and hence improve the performance of the III-V transistors.

Embodiments herein may present a semiconductor device. The semiconductor device may include isolation areas above a substrate to form a trench between the isolation areas. A first buffer layer is over the substrate, in contact with the substrate, and within the trench. A second buffer layer is within the trench over the first buffer layer, and in contact with the first buffer layer. A channel area is above the first buffer layer, above a portion of the second buffer layer that are below a source area or a drain area, and without being vertically above a portion of the second buffer layer. The channel area includes an III-V material. A high-k gate dielectric layer is above the first buffer layer and completely around the channel area. A gate electrode is above the first buffer layer without overlapping the second buffer layer, completely around the high-k gate dielectric layer, and completely around the channel area. In addition, the source area is above the second buffer layer, in contact with the second buffer layer, and adjacent to a first end of the channel area. The drain area is above the second buffer layer, in contact with the second buffer layer, and adjacent to a second end of the channel area that is opposite to the first end of the channel area.

Embodiments herein may present a method for forming a semiconductor device. The method may include forming isolation areas above a substrate and a trench between the isolation areas; forming a first buffer layer over the substrate, in contact with the substrate, and within the trench; and forming a second buffer layer over the first buffer layer, in contact with the first buffer layer, and within the trench. The method also includes forming a channel area including InP above a portion of the second buffer layer, and removing the portion of the second buffer layer under the channel area, while keeping the second buffer layer in areas not overlapping with the channel area. Furthermore, the method may include forming a high-k gate dielectric layer above the first buffer layer and completely around the channel area. Moreover, the method includes forming a gate electrode above the first buffer layer, completely around the high-k gate dielectric layer, and completely around the channel area. In addition, the method includes forming a source area above the second buffer layer, in contact with the second buffer layer, and adjacent to a first end of the channel area, and forming a drain area above the second buffer layer, in contact with the second buffer layer, and adjacent to a second end of the channel area that is opposite to the first end of the channel area.

Embodiments herein may present a computing device. The computing device may include a processor; and a memory device coupled to the processor, where the memory device or the processor includes a transistor. The transistor may include isolation areas above a substrate to form a trench between the isolation areas. A first buffer layer is over the substrate, in contact with the substrate, and within the trench. A second buffer layer is within the trench over the first buffer layer, and in contact with the first buffer layer. A channel area is above the first buffer layer, above a portion of the second buffer layer that are below a source area or a drain area, and without being vertically above a portion of the second buffer layer. The channel area includes an III-V material. A high-k gate dielectric layer is above the first buffer layer and completely around the channel area. A gate electrode is above the first buffer layer without overlapping the second buffer layer, completely around the high-k gate dielectric layer, and completely around the channel area. In addition, the source area is above the second buffer layer, in contact with the second buffer layer, and adjacent to a first end of the channel area. The drain area is above the second buffer layer, in contact with the second buffer layer, and adjacent to a second end of the channel area that is opposite to the first end of the channel area.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate.

In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1A:
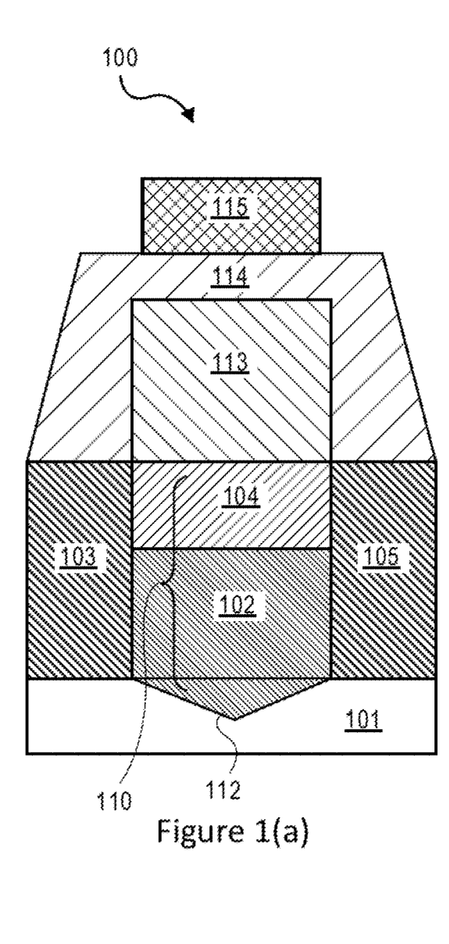
FIGS. 1(a)-1(c) schematically illustrate in various views an example III-V metal-oxide-semiconductor field effect transistor (MOSFET) including a channel area over a buffer layer within a trench, in accordance with some embodiments.
Figure 1B:
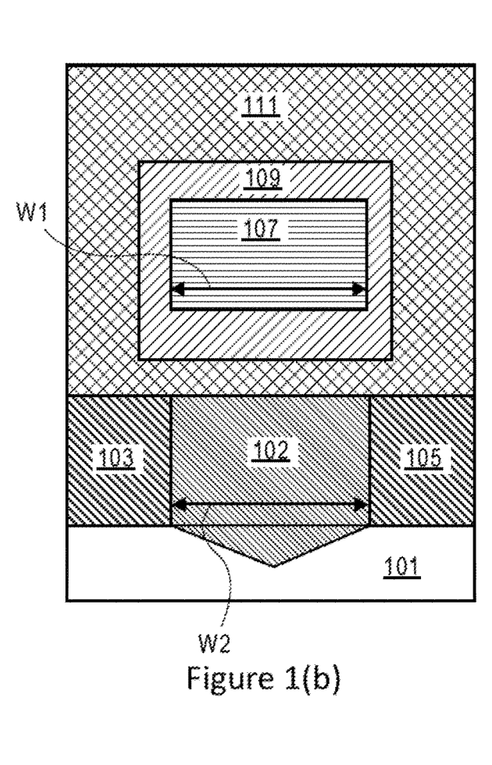
Figure 1C:
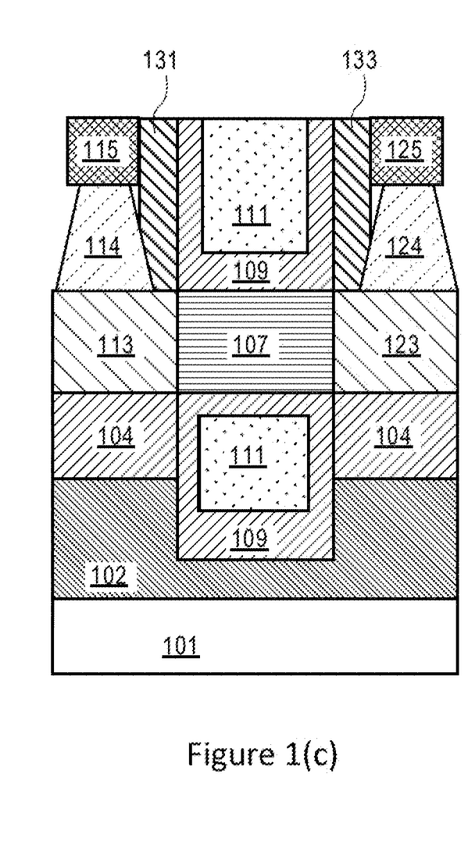

FIGS. 1(a)-1(c) schematically illustrate in various views an example III-V MOSFET 100 including a channel area 107 over a buffer layer 102 within a trench 110, in accordance with some embodiments. For example, FIG. 1(a) illustrates a cross section view of a fin cut at a source area or a drain area of the III-V MOSFET 100. FIG. 1(b) illustrates a cross section view of a fin cut at the gate electrode of the III-V MOSFET 100. FIG. 1(c) illustrates a cross section view of a gate cut at an active channel area or a fin of the III-V MOSFET 100. For clarity, features of the III-V MOSFET 100, the channel area 107, the buffer layer 102, or the trench 110, may be described below as examples for understanding an III-V MOSFET including a channel area over a buffer layer within a trench. Further, it is to be understood that one or more of the components of an III-V MOSFET including a channel area over a buffer layer within a trench, may include additional and/or varying features from the description below, and may include any device that one having ordinary skill in the art would consider and/or refer to as an III-V MOSFET including a channel area over a buffer layer within a trench.

In embodiments, the III-V MOSFET 100 includes a substrate 101. Isolation areas, e.g., an isolation area 103 and an isolation area 105, are above the substrate 101 to form the trench 110 between the isolation area 103 and the isolation area 105. The trench 110 may be an ART trench. In some other embodiments, the trench 110 may be other kind of trench. The buffer layer 102 is over the substrate 101, in contact with the substrate 101, and within the trench 110. A surface 112 of the substrate 101 that contacts with the buffer layer 102 is a non-planar surface, e.g., a triangular surface. A buffer layer 104 is within the trench 110 over the buffer layer 102, and in contact with the buffer layer 102. The buffer layer 104 is coplanar with a surface of the isolation area 103 and coplanar with a surface of the isolation area 105.

As shown in FIG. 1(b), the channel area 107 is above the buffer layer 102 and including an III-V material. The buffer layer 104 is removed below the channel area 107, hence the channel area 107 is vertically above the buffer layer 102, but not vertically above the buffer layer 104. The channel area 107 is above a portion of the buffer layer 104 that is below a source area 113 or a drain area 123 shown in FIG. 1(c). A gate dielectric layer 109 is above the buffer layer 102 and completely around the channel area 107. The gate dielectric layer may include high-k dielectric material. A gate electrode 111 is above the buffer layer 102 without overlapping the buffer layer 104, completely around the gate dielectric layer 109, and completely around the channel area 107.

As shown in FIG. 1(c), the source area 113 is above the buffer layer 104, in contact with the buffer layer 104, and adjacent to a first end of the channel area 107. The drain area 123 is above the buffer layer 104, in contact with the buffer layer 104, and adjacent to a second end of the channel area 107 that is opposite to the first end of the channel area 107. The channel area 107, the source area 113, and the drain area 123 are above the surface of the isolation area 103 and the isolation area 105. Furthermore, a second source area 114 is above the source area 113, and a source electrode 115 is coupled to the second source area 114. A second drain area 124 is above the drain area 123, and a drain electrode 125 is coupled to the second drain area 124. A spacer 131 separates the gate electrode 111 and the source electrode 115, while a spacer 133 separates the gate electrode 111 and the drain electrode 125. In some embodiments, there may not be any second source area or a second drain area. The source electrode 115 may be coupled to the source area 113, and the drain electrode 125 may be coupled to the drain area 123.

In embodiments, the channel area 107 may be a FinFET channel, a nanowire channel, a vertical FET channel, a nanotube channel, a gate-all-around channel, or a nanoribbon channel. The channel area 107 may have a width W1, and the trench 110 may have a width W2, which may be substantially equal to W1. The channel area 107 includes an III-V compound, which may be a binary III-V compound, a ternary III-V compound, or a quaternary III-V compound. In detail, the III-V compound in the channel area 107 may include indium (In), phosphorus (P), gallium (Ga), or arsenic (As), SiGe, Al, GaAs, $In_xGa_{1-x}As$, $In_xGa_{1-x}P$, $GaAs_xSb_{1-x}$, where x is between 0 and 1, InSb, InAs, GaP, InGaP, or InP. The channel area 107 may be of a rectangular shape, a triangular shape, a square shape, an oval shape, a circular shape, or a polygon shape.

In embodiments, the buffer layer 102 may include gallium arsenide (GaAs), poly-GaAs, InP, AlAs, GaP, AlAsSb, InAlAs, or $In_xGa_{1-x}As$, where x is between 0 and 1. The buffer layer 104 may include a material with an etch selectivity different from the III-V material in the channel area 107. For example, the buffer layer 102 includes GaAs, the buffer layer 104 includes $In_xGa_{1-x}As$, where x is between 0 and 1, and the III-V material in the channel area 107 includes InP.

In embodiments, the source area 113 or the drain area 123 may include a material similar to a material in the channel area 107, and may further include n-type dopant or p-type dopant. As an example, the source area 113 or the drain area 123 may include In, P, Ga, or As, indium gallium arsenide (InGaAs), indium arsenide (InAs), indium antimonide (InSb), indium gallium antimonide (InGaSb), indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$), indium aluminum arsenide antimonide ($In_xAl_{1-x}As_ySb_{1-y}$), indium aluminum arsenide phosphide ($In_xAl_{1-x}As_yP_{1-y}$), where $0 \leq x \leq 1$, $0 \leq y \leq 1$, a narrow bandgap III-V material, or any combination thereof.

In embodiments, the substrate 101 may be a silicon substrate, a glass substrate, such as soda lime glass or borosilicate glass, a metal substrate, a plastic substrate, a polyimide substrate, or other suitable substrate. The substrate 101 may include silicon, sapphire, SiC, GaN, AlN, $SiO_2$, or Cu. The substrate 101 may include a high-resistivity p-type or n-type vicinal silicon material, germanium, germanium on silicon, gallium arsenide (GaAs), or a silicon-on-insulator substrate. For example, the substrate 101 may be a silicon substrate with a (111), (100), or (110) crystal plane as a principal plane.

In embodiments, gate dielectric layer 109 may include a high-k dielectric material. For example, gate dielectric layer 109 may include a material with a dielectric constant of at least about 10. In detail, gate dielectric layer 109 may include $Al_2O_3$, although other materials such as $La_2O_3$, $HfO_2$, $ZrO_2$, or ternary complexes such as $LaAl_xO_y$, $Hf_xZr_yO_z$ may be used in other embodiments.

In embodiments, the source electrode 115, the drain electrode 125, or the gate electrode 111 may be formed as a single layer or a stacked layer using one or more conductive films including a conductive material. For example, the source electrode 115, the drain electrode 125, or the gate electrode 111 may include a metallic material, a conductive polymer, a polysilicon, a titanium silicide, a phosphorus (n+) doped Si, a boron doped SiGe, or an alloy of a semiconductor material and a metal. For example the source electrode 115, the drain electrode 125, or the gate electrode 111 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al, Ni, Cu, Cr, TiAlN, HfAlN, or InAlO. The source electrode 115, the drain electrode 125, or the gate electrode 111 may include tantalum nitride (TaN), titanium nitride (TiN), iridium-tantalum alloy (Ir—Ta), indium-tin oxide (ITO), the like, and/or a combination thereof.

Figure 2:
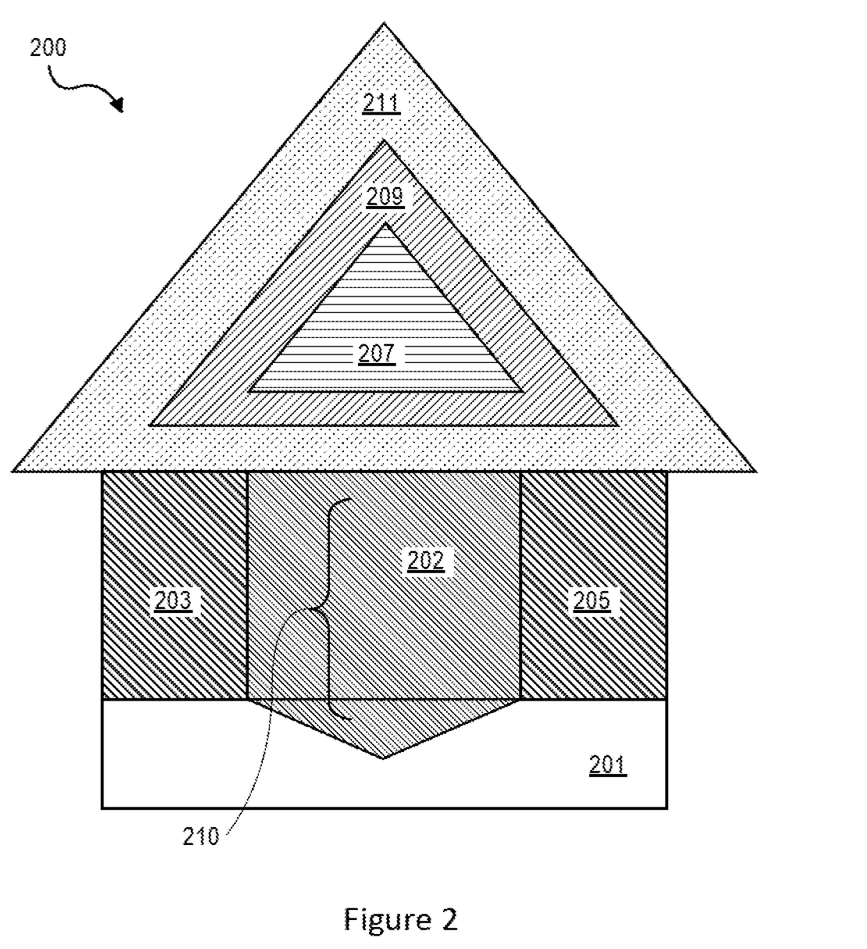
FIG. 2 schematically illustrates an example III-V MOSFET including a channel area over a buffer layer within a trench, in accordance with some embodiments.

FIG. 2 schematically illustrates an example III-V MOSFET 200 including a channel area 207 over a buffer layer 202 within a trench 210, in accordance with some embodiments. In embodiments, the III-V MOSFET 200, the channel area 207, the buffer layer 202, and the trench 210 may be similar to the III-V MOSFET 100, the channel area 107, the buffer layer 102, and the trench 110, respectively, as shown in FIG. 1.

In embodiments, the III-V MOSFET 200 includes a substrate 201. Isolation areas, e.g., an isolation area 203 and an isolation area 205, are above the substrate 201 to form the trench 210 between the isolation area 203 and the isolation area 205. The buffer layer 202 is over the substrate 201, in contact with the substrate 201, and within the trench 210. A second buffer layer, not shown, may be within the trench 210 over the buffer layer 202, and in contact with the buffer layer 202. The channel area 207 is above the buffer layer 202 and including an III-V material. The second buffer layer may be removed below the channel area 207, hence the channel area 207 is vertically above the buffer layer 102, but not vertically above the second buffer layer. A gate dielectric layer 209 is above the buffer layer 202 and completely around the channel area 207. The gate dielectric layer may include high-k dielectric material. A gate electrode 211 is above the buffer layer 202 without overlapping the second buffer layer, completely around the gate dielectric layer 209, and completely around the channel area 207.

In embodiments, the channel area 207 may be of a triangular shape, and of an 111 crystal orientation. III-V MOSFETs fabricated using current technologies may include an III-V material with 111 crystal orientation. The channel area 207 of 111 crystal orientation may reduce stacking faults, increase density of states and charge, improve surface roughness and gate dielectric uniformity for the channel area 207.

Figure 3:
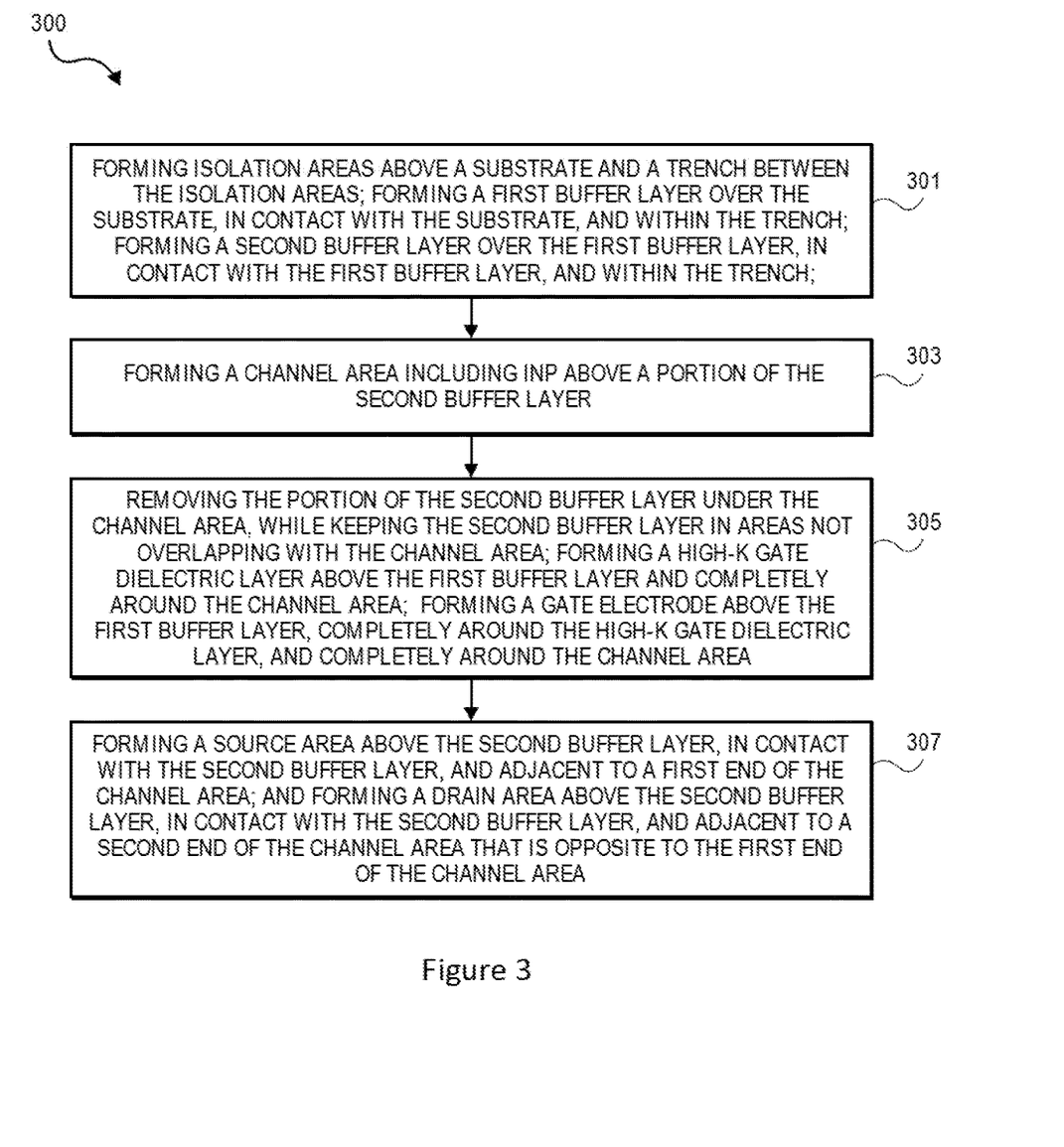
FIG. 3 schematically illustrates an example process for forming an III-V MOSFET including a channel area over a buffer layer within a trench, in accordance with some embodiments.

FIG. 3 schematically illustrates an example process 300 for forming an III-V MOSFET including a channel area over a buffer layer within a trench, in accordance with some embodiments. FIGS. 4(a)-4(f) schematically illustrate the example process 300 with more details for forming an III-V MOSFET including a channel area over a buffer layer within a trench, in accordance with some embodiments. In embodiments, the process 300 may be used to form the III-V MOSFET 100 as shown in FIG. 1 or the III-V MOSFET 200 as shown in FIG. 2.

Figure 4A:
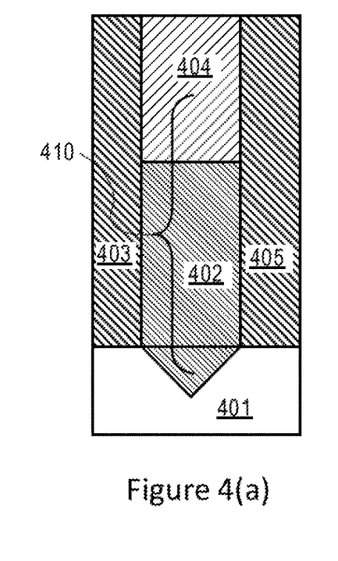
FIGS. 4(a)-4(f) schematically illustrate an example process with more details for forming an III-V MOSFET including a channel area over a buffer layer within a trench, in accordance with some embodiments.

At block 301, the process 300 may include forming isolation areas above a substrate and a trench between the isolation areas; forming a first buffer layer over the substrate, in contact with the substrate, and within the trench; and forming a second buffer layer over the first buffer layer, in contact with the first buffer layer, and within the trench. For example, as shown in FIG. 4(a), the process 300 may include forming isolation areas, e.g., an isolation area 403 and an isolation area 405, above a substrate 401 and a trench 410 between the isolation area 403 and the isolation area 405; forming a first buffer layer 402 over the substrate 401, in contact with the substrate 401, and within the trench 410; and forming a second buffer layer 404 over the first buffer layer 402, in contact with the first buffer layer 402, and within the trench 410.

Figure 4B:
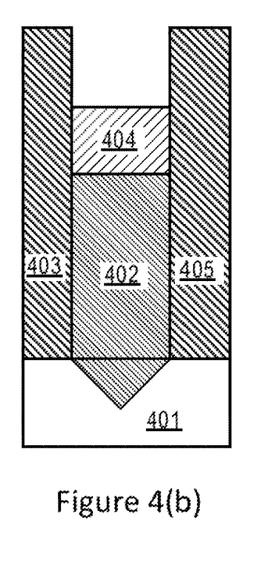
Figure 4C:
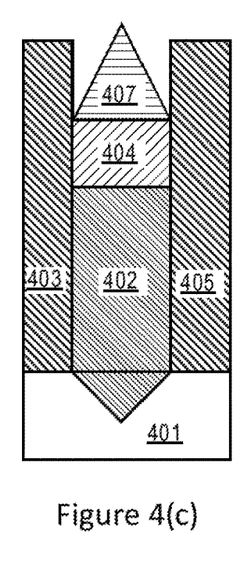
Figure 4D:
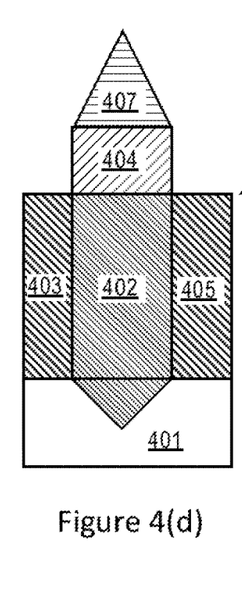

At block 303, the process 300 may include forming a channel area including an III-V material, e.g., InP, above a portion of the second buffer layer. For example, as shown in FIGS. 4(b)-4(d), the process 300 may include forming a recess of the second buffer layer 404 as shown in FIG. 4(b), forming a channel area 407 above the remaining second buffer layer 404 as shown in FIG. 4(c), and removing a portion of the isolation area 403 and the isolation area 405 to expose the second buffer layer 404 as shown in FIG. 4(d). The channel area 407 may include InP, or some other III-V materials, e.g., an III-V material as shown for the channel area 107 in FIG. 1.

Figure 4E:
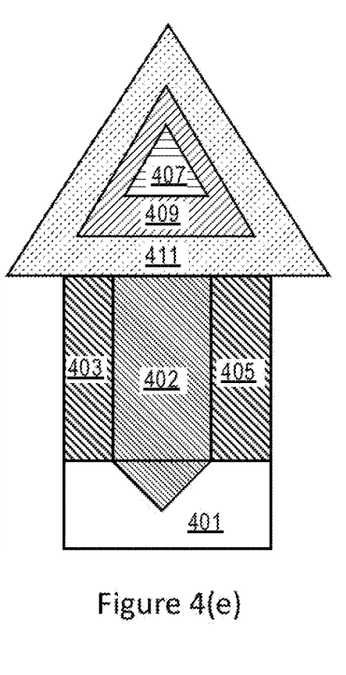

At block 305, the process 300 may include removing the portion of the second buffer layer under the channel area, while keeping the second buffer layer in areas not overlapping with the channel area; forming a high-k gate dielectric layer above the first buffer layer and completely around the channel area; forming a gate electrode above the first buffer layer, completely around the high-k gate dielectric layer, and completely around the channel area. For example, as shown in FIG. 4(e), the process 300 may include removing the portion of the second buffer layer 404 under the channel area 407. The second buffer layer 404 may not be removed in areas not overlapping with the channel area 407. The process 300 may further include forming a high-k gate dielectric layer 409 above the first buffer layer 402 and completely around the channel area 407; and forming a gate electrode 411 above the first buffer layer 402, completely around the high-k gate dielectric layer 409, and completely around the channel area 407.

Figure 4F:
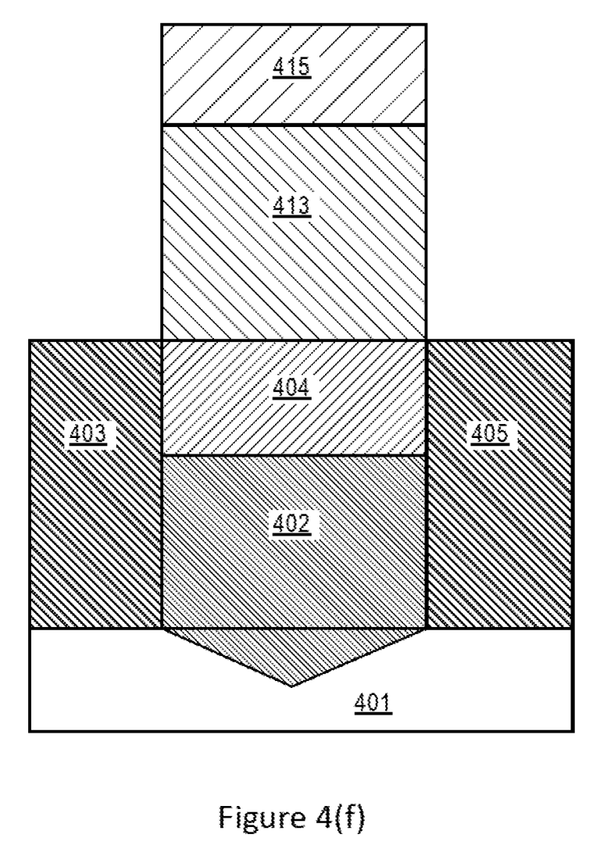

At block 307, the process 300 may include forming a source area above the second buffer layer, in contact with the second buffer layer, and adjacent to a first end of the channel area; and forming a drain area above the second buffer layer, in contact with the second buffer layer, and adjacent to a second end of the channel area that is opposite to the first end of the channel area. For example, as shown in FIG. 4(f), the process 300 may include forming a source area 413 above the second buffer layer 404, in contact with the second buffer layer 404, and adjacent to a first end of the channel area 407. The process 300 may also include and forming a drain area above the second buffer layer 404, in contact with the second buffer layer 404, and adjacent to a second end of the channel area 407 that is opposite to the first end of the channel area.

In addition, the process 300 may include forming a source electrode in contact with the source area, and forming a drain electrode in contact with the drain area, a spacer between the source electrode and the gate electrode 411, and a spacer between the drain electrode and the gate electrode 411.

Figure 5:
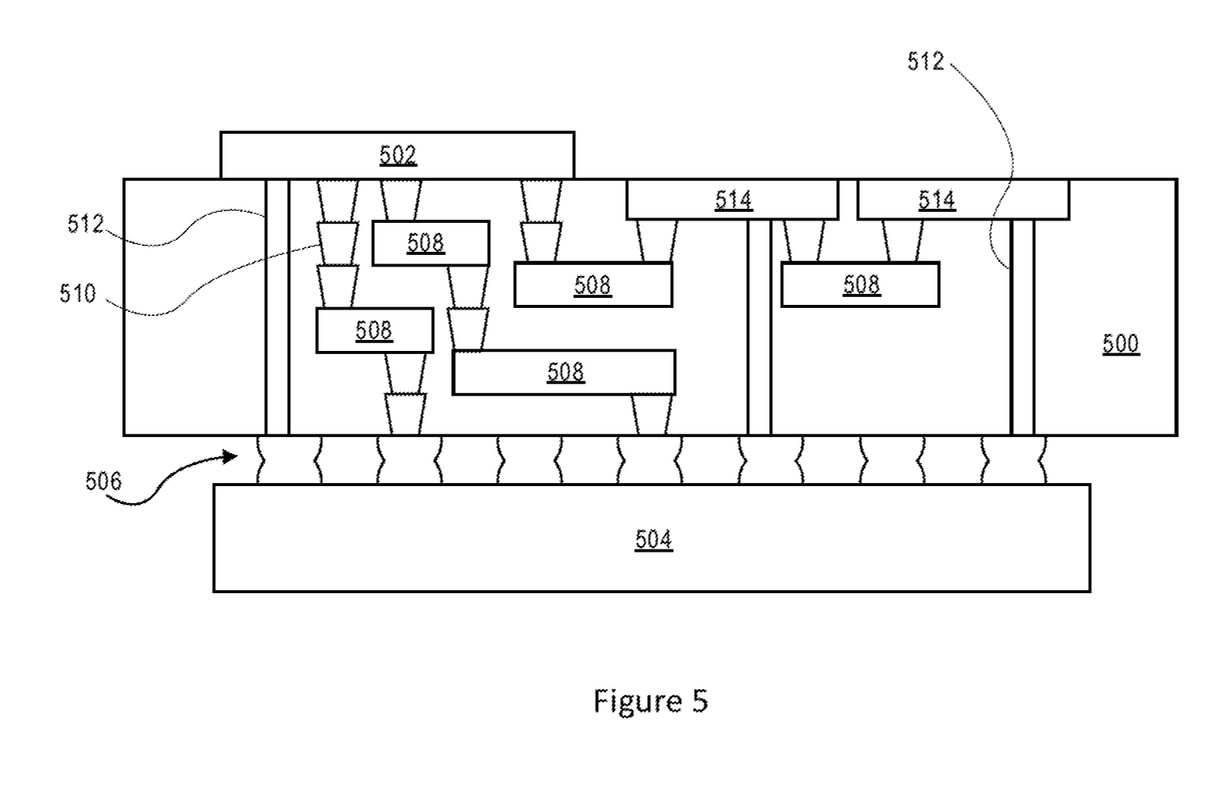
FIG. 5 schematically illustrates an interposer implementing one or more embodiments of the disclosure, in accordance with some embodiments.

FIG. 5 illustrates an interposer 500 that includes one or more embodiments of the disclosure. The interposer 500 is an intervening substrate used to bridge a first substrate 502 to a second substrate 504. The first substrate 502 may be, for instance, a substrate support the III-V MOSFET 100 as shown in FIG. 1, the III-V MOSFET 200 as shown in FIG. 2, or an III-V MOSFET formed by the process 300 shown in FIG. 3 or FIG. 4. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
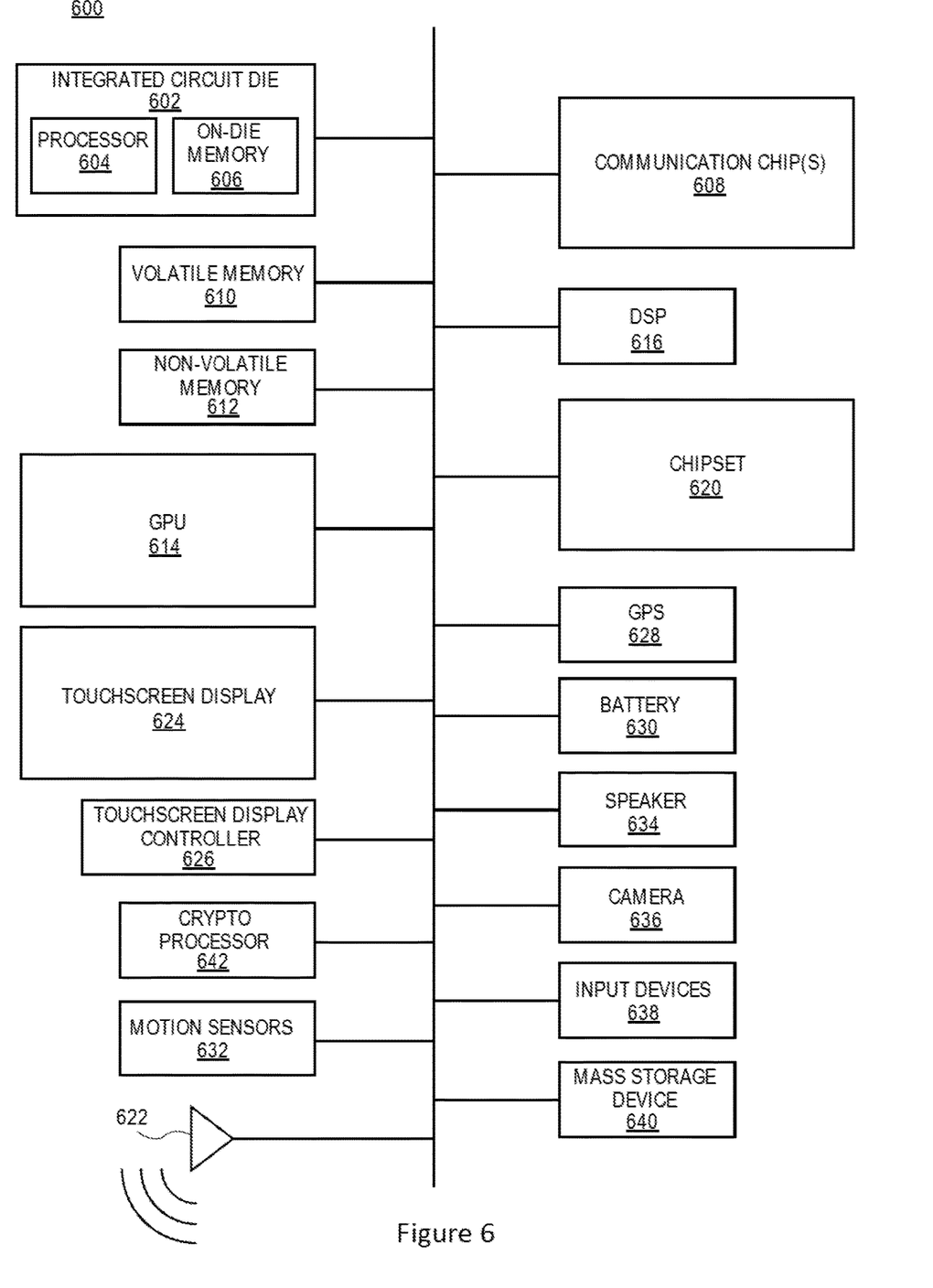
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the processor 604 or the on-die memory 606, or other control circuits in the integrated circuit die 602 may include the III-V MOSFET 100 as shown in FIG. 1, the III-V MOSFET 200 as shown in FIG. 2, or an III-V MOSFET formed by the process 300 shown in FIG. 3 or FIG. 4.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (µLED) display, or others.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power electronic device 631, a voltage regulator (not shown), a global positioning system (GPS) device 628, a compass, a motion coprocessor or sensors 632 (that may include an accelerometer, a gyroscope, and a compass), a microphone (not shown), a speaker 634, a resonator 635, a camera 636, user input devices 638 (such as a keyboard, mouse, stylus, and touchpad), and a mass storage device 640 (such as hard disk drive, compact disk (CD), digital versatile disk (DVD), and so forth). In embodiments, various components may include the III-V MOSFET 100 as shown in FIG. 1, the III-V MOSFET 200 as shown in FIG. 2, or an III-V MOSFET formed by the process 300 shown in FIG. 3 or FIG. 4.

The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as the power electronic device 631, that are formed in accordance with implementations of the current disclosure, e.g., the III-V MOSFET 100 as shown in FIG. 1, the III-V MOSFET 200 as shown in FIG. 2, or an III-V MOSFET formed by the process 300 shown in FIG. 3 or FIG. 4.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a semiconductor device, comprising: isolation areas above a substrate to form a trench between the isolation areas; a first buffer layer over the substrate, in contact with the substrate, and within the trench; a second buffer layer within the trench over the first buffer layer, in contact with the first buffer layer; a channel area above the first buffer layer, above a portion of the second buffer layer that are below a source area or a drain area, and without being vertically above a portion of the second buffer layer, wherein the channel area includes an III-V material; a high-k gate dielectric layer above the first buffer layer and completely around the channel area; a gate electrode above the first buffer layer without overlapping the second buffer layer, completely around the high-k gate dielectric layer, and completely around the channel area; the source area above the second buffer layer, in contact with the second buffer layer, and adjacent to a first end of the channel area; and the drain area above the second buffer layer, in contact with the second buffer layer, and adjacent to a second end of the channel area that is opposite to the first end of the channel area.

Example 2 may include the semiconductor device of example 1 and/or some other examples herein, further comprising: a source electrode coupled to the source area; and a drain electrode coupled to the drain area.

Example 3 may include the semiconductor device of example 1 and/or some other examples herein, wherein the second buffer layer is coplanar with a surface of the isolation areas, while the channel area, the source area, and the drain area are above the surface of the isolation areas.

Example 4 may include the semiconductor device of example 1 and/or some other examples herein, wherein a surface of the substrate that contacts with the first buffer layer is a non-planar surface.

Example 5 may include the semiconductor device of example 1 and/or some other examples herein, wherein the channel area is of a shape selected from the group consisting of rectangular shape, a square shape, an oval shape, and a circular shape, and the trench has a width that is substantially equal to a width of the channel area.

Example 6 may include the semiconductor device of example 1 and/or some other examples herein, wherein the channel area includes a channel selected from the group consisting of a nanowire channel, a nanoribbon channel, and a gate-all-around channel.

Example 7 may include the semiconductor device of example 1 and/or some other examples herein, wherein the channel area is of a triangular shape.

Example 8 may include the semiconductor device of example 1 and/or some other examples herein, wherein the channel area is of an 111 crystal orientation.

Example 9 may include the semiconductor device of example 1 and/or some other examples herein, wherein the III-V material of the channel area includes a material selected from the group consisting of indium (In), phosphorus (P), gallium (Ga), and arsenic (As).

Example 10 may include the semiconductor device of example 1 and/or some other examples herein, wherein the source area, or the drain area includes n-type dopant.

Example 11 may include the semiconductor device of example 1 and/or some other examples herein, wherein the source area or the drain area includes a material selected from the group consisting of In, P, Ga, or As, indium gallium arsenide (InGaAs), indium arsenide (InAs), indium antimonide (InSb), indium gallium antimonide (InGaSb), indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$), indium aluminum arsenide antimonide ($In_xAl_{1-x}As_ySb_{1-y}$), indium aluminum arsenide phosphide ($In_xAl_{1-x}As_yP_{1-y}$), where $0 \leq x \leq 1$, $0 \leq y \leq 1$, a narrow bandgap III-V material, and any combination thereof.

Example 12 may include the semiconductor device of example 1 and/or some other examples herein, wherein the substrate includes a material selected from the group consisting of a high-resistivity p-type or n-type vicinal silicon material, germanium, germanium on silicon, gallium arsenide (GaAs), and a silicon-on-insulator substrate.

Example 13 may include the semiconductor device of example 1 and/or some other examples herein, wherein the first buffer layer includes a material selected from the group consisting of gallium arsenide (GaAs), poly-GaAs, InP, AlAs, GaP, AlAsSb, InAlAs, and $In_xGa_{1-x}As$, where x is between 0 and 1.

Example 14 may include the semiconductor device of example 1 and/or some other examples herein, wherein the second buffer layer includes a material with an etch selectivity different from the III-V material in the channel area.

Example 15 may include the semiconductor device of example 1 and/or some other examples herein, wherein the first buffer layer includes GaAs, the second buffer layer includes $In_xGa_{1-x}As$, where x is between 0 and 1, and the III-V material in the channel area includes InP.

Example 16 may include a method for forming a semiconductor device, the method comprising: forming isolation areas above a substrate and a trench between the isolation areas; forming a first buffer layer over the substrate, in contact with the substrate, and within the trench; forming a second buffer layer over the first buffer layer, in contact with the first buffer layer, and within the trench; forming a channel area including InP above a portion of the second buffer layer; removing the portion of the second buffer layer under the channel area, while keeping the second buffer layer in areas not overlapping with the channel area; forming a high-k gate dielectric layer above the first buffer layer and completely around the channel area; forming a gate electrode above the first buffer layer, completely around the high-k gate dielectric layer, and completely around the channel area; forming a source area above the second buffer layer, in contact with the second buffer layer, and adjacent to a first end of the channel area; and forming a drain area above the second buffer layer, in contact with the second buffer layer, and adjacent to a second end of the channel area that is opposite to the first end of the channel area.

Example 17 may include the method of example 16 and/or some other examples herein, wherein the removing the second buffer layer under the channel area includes removing the second buffer layer under the channel area by selective etching.

Example 18 may include the method of example 16 and/or some other examples herein, wherein the second buffer layer is coplanar with a surface of the isolation areas, while the channel area, the source area, and the drain area are above the surface of the isolation areas.

Example 19 may include the method of example 16 and/or some other examples herein, wherein the channel area is of a triangular shape, and of an 111 crystal orientation.

Example 20 may include the method of example 16 and/or some other examples herein, wherein the first buffer layer includes a material selected from the group consisting of gallium arsenide (GaAs), poly-GaAs, InP, AlAs, GaP, AlAsSb, InAlAs, and $In_xGa_{1-x}As$, where x is between 0 and 1.

Example 21 may include the method of example 16 and/or some other examples herein, wherein the first buffer layer includes GaAs, and the second buffer layer includes $In_xGa_{1-x}As$, where x is between 0 and 1.

Example 22 may include a computing device, comprising: a processor; and a memory device coupled to the processor, wherein the memory device or the processor includes a transistor comprising: isolation areas above a substrate to form a trench between the isolation areas; a first buffer layer over the substrate, in contact with the substrate, and within the trench; a second buffer layer within the trench over the first buffer layer, in contact with the first buffer layer; a channel area above the first buffer layer, above a portion of the second buffer layer that are below a source area or a drain area, and without being vertically above a portion of the second buffer layer, wherein the channel area includes an III-V material; a high-k gate dielectric layer above the first buffer layer and completely around the channel area; a gate electrode above the first buffer layer without overlapping the second buffer layer, completely around the high-k gate dielectric layer, and completely around the channel area; the source area above the second buffer layer, in contact with the second buffer layer, and adjacent to a first end of the channel area; and the drain area above the second buffer layer, in contact with the second buffer layer, and adjacent to a second end of the channel area that is opposite to the first end of the channel area.

Example 23 may include the computing device of example 22 and/or some other examples herein, wherein a surface of the substrate that contacts with the first buffer layer is a non-planar surface.

Example 24 may include the computing device of example 22 and/or some other examples herein, wherein the first buffer layer includes GaAs, the second buffer layer includes $In_xGa_{1-x}As$, where x is between 0 and 1, and the III-V material in the channel area includes InP.

Example 25 may include the computing device of example 22 and/or some other examples herein, wherein the computing device includes a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
    isolation areas above a substrate to form a trench between the isolation areas;
    a first buffer layer over the substrate, in contact with the substrate, and within the trench;
    a second buffer layer within the trench over the first buffer layer, in contact with the first buffer layer;
    a channel area above the first buffer layer, above a portion of the second buffer layer that are below a source area or a drain area, wherein the channel area includes an III-V material;
    a high-k gate dielectric layer above the first buffer layer and completely around the channel area;
    a gate electrode above the first buffer layer, completely around the high-k gate dielectric layer, and completely around the channel area, wherein the gate electrode has a bottommost surface below the channel area, the bottommost surface of the gate electrode below a top of the second buffer layer and above a bottom of the first buffer layer;
    the source area above the second buffer layer, in direct contact with the second buffer layer, and adjacent to a first end of the channel area; and
    the drain area above the second buffer layer, in direct contact with the second buffer layer, and adjacent to a second end of the channel area that is opposite to the first end of the channel area.

2. The semiconductor device of claim 1, further comprising:
    a source electrode coupled to the source area; and
    a drain electrode coupled to the drain area.

3. The semiconductor device of claim 1, wherein the second buffer layer is coplanar with a surface of the isolation areas, while the channel area, the source area, and the drain area are above the surface of the isolation areas.

4. The semiconductor device of claim 1, wherein a surface of the substrate that contacts with the first buffer layer is a non-planar surface.

5. The semiconductor device of claim 1, wherein the channel area is of a shape selected from the group consisting of rectangular shape, a square shape, an oval shape, and a circular shape, and the trench has a width that is substantially equal to a width of the channel area.

6. The semiconductor device of claim 1, wherein the channel area includes a channel selected from the group consisting of a nanowire channel, a nanoribbon channel, and a gate-all-around channel.

7. The semiconductor device of claim 1, wherein the channel area is of a triangular shape.

8. The semiconductor device of claim 1, wherein the channel area is of an 111 crystal orientation.

9. The semiconductor device of claim 1, wherein the III-V material of the channel area includes a material selected from the group consisting of indium (In), phosphorus (P), gallium (Ga), and arsenic (As).

10. The semiconductor device of claim 1, wherein the source area, or the drain area includes n-type dopant.

11. The semiconductor device of claim 1, wherein the source area or the drain area includes a material selected from the group consisting of In, P, Ga, or As, indium gallium arsenide (InGaAs), indium arsenide (InAs), indium antimonide (InSb), indium gallium antimonide (InGaSb), indium gallium arsenide antimonide ($In_xGa_{1-x}As_ySb_{1-y}$), indium gallium arsenide phosphide ($In_xGa_{1-x}As_yP_{1-y}$), indium gallium phosphide antimonide ($In_xGa_{1-x}P_ySb_{1-y}$), indium aluminum arsenide antimonide ($In_xAl_{1-x}As_ySb_{1-y}$), indium aluminum arsenide phosphide ($In_xAl_{1-x}As_yP_{1-y}$), where $0 \le x \le 1$, $0 \le y \le 1$, a narrow bandgap III-V material, and any combination thereof.

12. The semiconductor device of claim 1, wherein the substrate includes a material selected from the group consisting of a high-resistivity p-type or n-type vicinal silicon material, germanium, germanium on silicon, gallium arsenide (GaAs), and a silicon-on-insulator substrate.

13. The semiconductor device of claim 1, wherein the first buffer layer includes a material selected from the group consisting of gallium arsenide (GaAs), poly-GaAs, InP, AlAs, GaP, AlAsSb, InAlAs, and $In_xGa_{1-x}As$, where x is between 0 and 1.

14. The semiconductor device of claim 1, wherein the second buffer layer includes a material with an etch selectivity different from the III-V material in the channel area.

15. The semiconductor device of claim 1, wherein the first buffer layer includes GaAs, the second buffer layer includes $In_xGa_{1-x}As$, where x is between 0 and 1, and the III-V material in the channel area includes InP.

16. The semiconductor device of claim 1, wherein the channel area is not vertically above the second buffer layer.

17. The semiconductor device of claim 1, wherein the gate electrode does not overlap the second buffer layer.

18. A computing device, comprising:
a processor; and
a memory device coupled to the processor, wherein the memory device or the processor includes a transistor comprising:
isolation areas above a substrate to form a trench between the isolation areas;
a first buffer layer over the substrate, in contact with the substrate, and within the trench;
a second buffer layer within the trench over the first buffer layer, in contact with the first buffer layer;
a channel area above the first buffer layer, above a portion of the second buffer layer that are below a source area or a drain area, wherein the channel area includes an III-V material;
a high-k gate dielectric layer above the first buffer layer and completely around the channel area;
a gate electrode above the first buffer layer, completely around the high-k gate dielectric layer, and completely around the channel area, wherein the gate electrode has a bottommost surface below the channel area, the bottommost surface of the gate electrode below a top of the second buffer layer and above a bottom of the first buffer layer;
the source area above the second buffer layer, in direct contact with the second buffer layer, and adjacent to a first end of the channel area; and
the drain area above the second buffer layer, in direct contact with the second buffer layer, and adjacent to a second end of the channel area that is opposite to the first end of the channel area.

19. The computing device of claim 18, wherein a surface of the substrate that contacts with the first buffer layer is a non-planar surface.

20. The computing device of claim 18, wherein the first buffer layer includes GaAs, the second buffer layer includes $In_xGa_{1-x}As$, where x is between 0 and 1, and the III-V material in the channel area includes InP.

21. The computing device of claim 18, wherein the computing device includes a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

22. A semiconductor device, comprising:
isolation areas above a substrate to form a trench between the isolation areas;
a first buffer layer over the substrate, in contact with the substrate, and within the trench;
a second buffer layer within the trench over the first buffer layer, in contact with the first buffer layer;
a channel area above the first buffer layer, above a portion of the second buffer layer that are below a source area or a drain area, wherein the channel area includes an III-V material;
a high-k gate dielectric layer above the first buffer layer and completely around the channel area;
a gate electrode above the first buffer layer, completely around the high-k gate dielectric layer, and completely around the channel area, wherein the gate electrode has a bottommost surface below the channel area, the bottommost surface of the gate electrode below a top of the second buffer layer and above a bottom of the first buffer layer;
the source area above the second buffer layer, in contact with the second buffer layer, and adjacent to a first end of the channel area; and
the drain area above the second buffer layer, in contact with the second buffer layer, and adjacent to a second end of the channel area that is opposite to the first end of the channel area, wherein the second buffer layer is coplanar with a surface of the isolation areas, while the channel area, the source area, and the drain area are above the surface of the isolation areas.

* * * * *